United States Patent
Kanesaka

[11] Patent Number: 6,100,671
[45] Date of Patent: Aug. 8, 2000

[54] ELECTRONIC EQUIPMENT POWER CHARGING SYSTEM

[75] Inventor: Toshiya Kanesaka, Chiba, Japan

[73] Assignee: Seiko Instruments Inc., Japan

[21] Appl. No.: 09/167,437

[22] Filed: Oct. 6, 1998

[30] Foreign Application Priority Data

Oct. 7, 1997 [JP] Japan ................................ 9-274409
Mar. 23, 1998 [JP] Japan ................................ 10-074665

[51] Int. Cl.[7] ................................................ H01M 10/44
[52] U.S. Cl. ...................... 320/150; 320/101; 136/204; 136/293
[58] Field of Search ................................ 320/101, 150; 136/204, 207, 293

[56] References Cited

U.S. PATENT DOCUMENTS 4,213,292  7/1980  Dolezal et al. ......................... 368/204

FOREIGN PATENT DOCUMENTS 2396876  3/1979  France ........................... F02B 65/00
06-201245  7/1994  Japan ........................... F25B 21/02
08-193717  1/1995  Japan ........................... F24C 3/10

Primary Examiner—Peter S. Wong
Assistant Examiner—Gregory J. Toatley
Attorney, Agent, or Firm—Adams & Wilks

[57] ABSTRACT

An electronic equipment power charging system has a temperature difference producing device for converting external electrical energy to heat. The temperature difference producing device has heat sources for outputting heat having different temperatures to produce a temperature difference. An electronic equipment has an electrothermal power generator for generating electrical power using the temperature difference produced by the temperature difference producing device to drive the electronic equipment. A measurement device measures the temperatures of the heat outputted by the heat sources of the temperature difference producing device. A control device controls the temperatures of the heat outputted by the heat sources of the temperature difference producing device in accordance with the temperatures measured by the measurement device.

33 Claims, 12 Drawing Sheets

ELECTRONIC EQUIPMENT POWER CHARGING SYSTEM

BACKGROUND OF THE INVENTION

1. Field of the Invention

This invention relates to an electronic equipment power charging system for generating and charging power of electronic equipment having an electrothermal power generator and power charging means by producing a temperature difference using external energy.

2. Description of the Related Art

An electrothermal power generators for generating power using a temperature difference and an electrothermal power generation watch are well known in Japanese Patent Application Laid-open Nos. Sho 57-189584 and Sho 55-20483. The electrothermal power generator and electrothermal power generation watch generate power using sites or environment in which a temperature difference already exists, to thereby acquire electric energy, and operate.

An electronic watch having an electrothermal power generator or an electrothermal element (hereinafter referred to as an electrothermal watch) does not generate power if there is no temperature difference around an electric heat converting element. For example, such electrothermal watch has been structured to generate power using a temperature difference between an arm and an atmosphere; however, the watch does not generate power if the body temperature is identical to the temperature of the atmosphere. When an electrothermal power generator is used under an environment in which a temperature difference cannot be produced, power generation using the electrothermal power generator stops or is reduced. Thus, electric energy charged by the accumulator is consumed, and there is a possibility of stopping operation of a circuit connected to the accumulator or failing to restart the operation. When an electrothermal watch is placed by removing it from an arm, there is a possibility of failing to generate electrothermal power, and also there is a possibility of exhausting electric energy of the accumulator. Thus, it is required to charge the accumulator to restart the electrothermal watch in which all the accumulator electric energy is consumed. However, there has been a problem that a temperature difference is required for generating power and such electrothermal power generator and electrothermal watch fail to start or operate, or stop in the case or under an environment where the temperature difference is not produced.

SUMMARY OF THE INVENTION

To solve the foregoing problem, the present invention provides the following means.

A power charging system is provided outside of an electronic equipment having an electrothermal power generator. This power charging system comprises temperature difference producing means for producing a temperature difference using electric energy from the outside of the power charging. The power charging system generates power by imparting a temperature difference to the electronic equipment having an electrothermal power generator placed in the power charging system.

BRIEF DESCRIPTION OF THE DRAWINGS

For a more better understanding of the present invention, reference is made of a detailed description to be read in conjunction with the accompanying drawings, in which.

DETAILED DESCRIPTION OF THE PREFERRED EMBODIMENTS

The present invention will now be described below with reference to the drawings.

As an example of an electrothermal power generator employed in embodiments according to the present invention, there is provided an electrothermal power generator whose power is generated by imparting a temperature difference using the principle of Seebech effect. In the present invention, even if there is provided an electrothermal power generator other than the generator whose power is generated by imparting a temperature difference using the principle of Seebech effect, there is obtained advantageous effects when such electrothermal power generator has means for generating power by imparting a temperature difference. As an example of an electronic equipment having an electrothermal power generator employed in embodiments according to the present invention, there is employed an electronic watch having an electrothermal power generator. Hereinafter, an electronic watch having an electrothermal power generator is referred to as an electrothermal watch.

Figure 5:
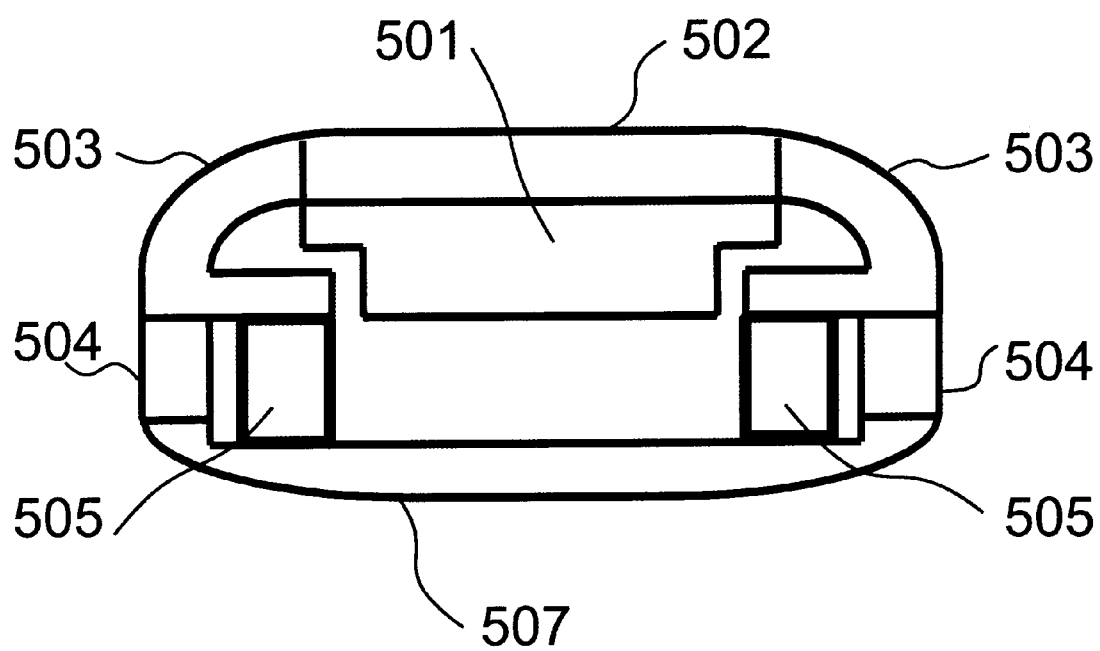
FIG. 5 is a sectional view of an electronic watch illustrating an embodiment of electronic equipment having an electrothermal power generator according to the present invention.

FIG. 5 is a sectional view of an electronic watch having an electrothermal power generator to be employed in embodiments according to the present invention. The electrothermal watch comprises a watch movement 501 including power accumulating means for accumulating electricity generated by the electrothermal power generator, a wind proof glass 502, an electrothermal power generator 505, a case 503 connected to a low-temperature heat electrode of the electrothermal power generator 505, a bottom cap 507 connected to a high-temperature heat electrode of the electrothermal power generator 505, and a heat insulating material 504 that is a part of a case insulating the case 503 and the bottom cap 507. When an electrothermal watch is worn on an arm, a heat is radiated by the case 503 at the same time when the bottom cap 507 is warmed by a body temperature. This produces a temperature difference between the bottom cap 507 and the case 503. The electrothermal power generator 505 acquires a temperature difference by obtaining heat of an arm from the bottom cap 507 and at the same time by obtaining the atmospheric heat from the case 503 and generates power. The electricity thus generated is used for driving the watch or is accumulated by accumulating means.

Figure 1:
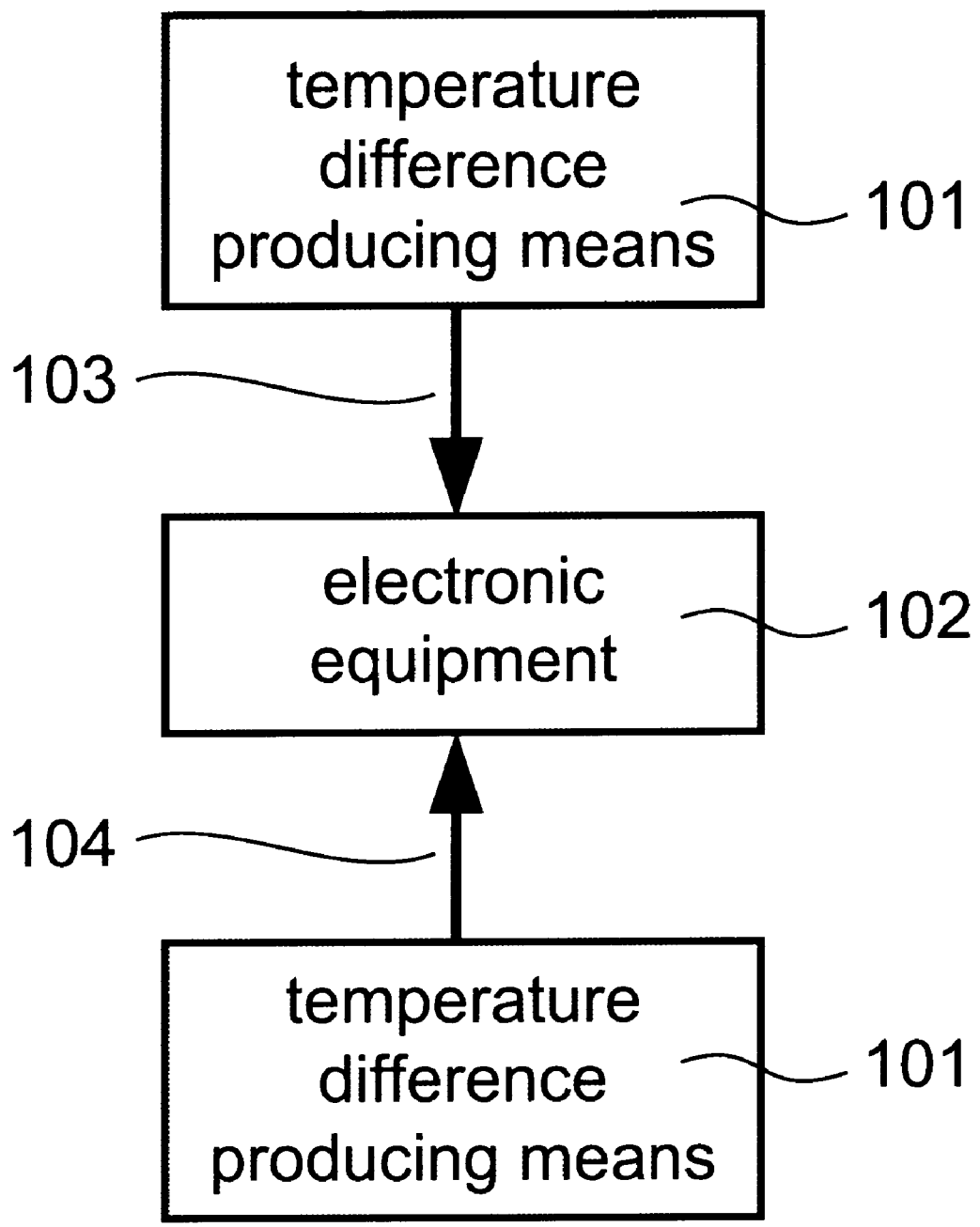
FIG. 1 is a structural view showing a first embodiment of an electronic equipment power charging system having an electrothermal power generator according to the present invention.

FIG. 1 is a structural view showing a first embodiment of an electronic equipment power charging system having an electrothermal power generator according to the present invention. The power charging system comprises an electronic equipment 102 having an electrothermal power generator and a power charging portion having temperature difference producing means 101 that is placed adjacent to the electronic equipment 102 and that produces a temperature difference using external electric energy. The temperature difference producing means 101 produces a temperature difference by converting energy from the outside of the power charger to a heat. The electronic equipment 102 is an electronic equipment having an electrothermal power generator. A first output 103 of the temperature difference producing means 101 imparts the heat of a temperature higher than that of a low-temperature heat electrode to a high-temperature heat electrode of the electrothermal power generator incorporated in the electronic equipment. A second output 104 of the temperature difference producing means 101 imparts the heat of a temperature lower than that of the high-temperature heat electrode to the low-temperature heat electrode of the electrothermal power generator incorporated in the electronic equipment. The electrothermal power generator incorporated in the electronic equipment generates power by a temperature difference of the heat obtained by the first output 103 of the temperature difference producing means 101 and the second output 104 of the temperature difference producing means 101.

Figure 2:
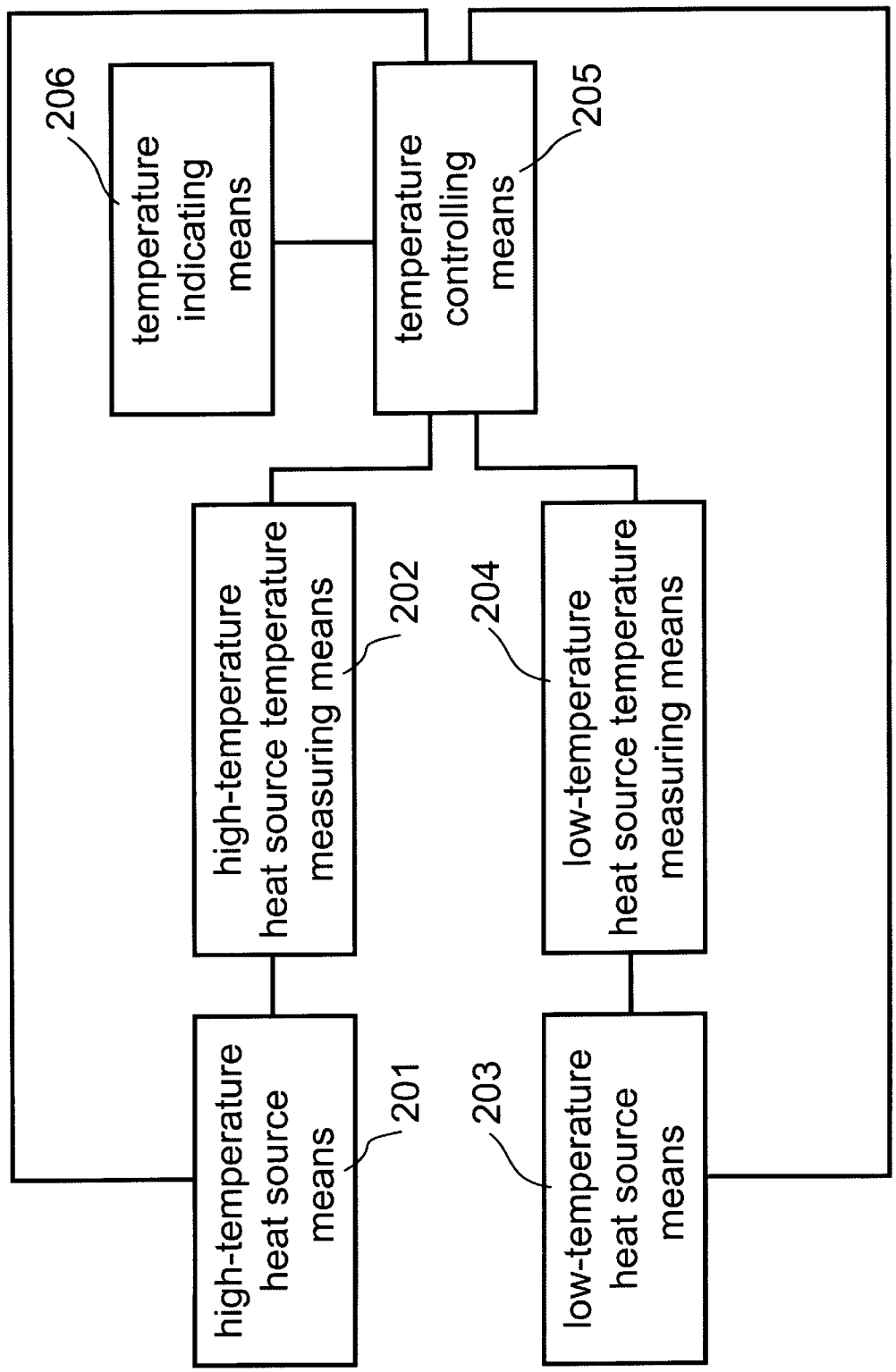
FIG. 2 is a structural view showing a second embodiment of an electronic equipment power charging system having an electrothermal power generator according to the present invention.

FIG. 2 is a structural view showing a second embodiment of an electronic equipment power charging system having an electrothermal power generator according to the present invention. The power charging system comprises high-temperature heat source means 201, high-temperature heat source temperature measuring means 202, low-temperature heat source means 203, low-temperature heat source temperature measuring means 204, temperature controlling means 205, and temperature indicating means 206. The high-temperature heat source means 201 imparts the heat of a temperature higher than that of the low-temperature heat electrode to the high-temperature heat electrode of the electrothermal power generator. The low-temperature heat source means 203 imparts the heat of a temperature lower than that of the high-temperature heat electrode to the low-temperature heat electrode of the electrothermal power generator. The electrothermal power generator acquires a temperature difference by obtaining the heat from the high-temperature heat source means 201 and the low-temperature heat source means 203 and generates power. The high-temperature heat source temperature measuring means 202 measures a temperature of the high-temperature heat source means 201 and outputs the measured temperature data to the temperature controlling means 205. The low-temperature heat source temperature measuring means 204 measures a temperature of the low-temperature heat source means 203 and outputs the measured temperature data to the temperature controlling means 205. The temperature indicating means 206 outputs to the temperature controlling means 205 temperature data required for the electrothermal power generator to generate power or charge the generated power.

The temperature controlling means 205 controls temperatures either one or both of the high-temperature heat source means 201 and the low-temperature heat source means 203 so as temperatures of the high-temperature heat source means 201 and the low-temperature heat source means 203 to be a temperature indicated by the temperature indicating means 206. As a result, since a temperature difference is produced between the high-temperature heat electrode and the low-temperature heat electrode of the electrothermal power generator, the electronic equipment having the electrothermal power generator generates power. Here, if there is a temperature difference, power may be generated; however, if an absolute temperature rises, electric leakage of the electronic equipment increases; therefore, there is a possibility that the power consumed exceeds the power to be generated. Therefore, the temperature indicating means 206 further indicates that the power consumed does not exceed the generated power.

Figure 3:
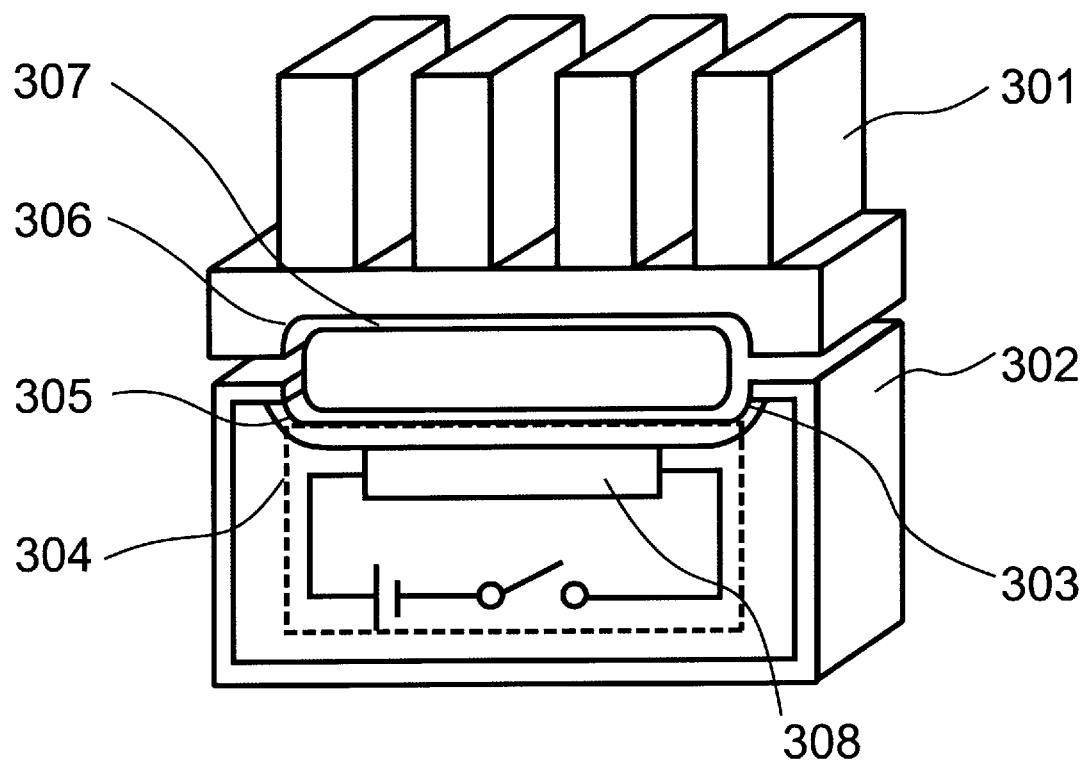
FIG. 3 is a perspective view of an electronic equipment power charging system having an electrothermal power generator according to the present invention.

FIG. 3 is a perspective view of an electronic equipment power charging system having an electrothermal power generator in embodiments according to the present invention. The structure of an electrothermal watch 307 is similar to that of an electronic watch shown in FIG. 5.

A heat sink 301 radiates the heat of a low-temperature heat electrode to the outside in contact with a case connected to the low-temperature heat electrode of the electrothermal watch 307. The heat sink 301 is also employed as low-temperature heat electrode connecting means. A contact face 306 with the electrothermal watch and the electrothermal watch 307 are engaged with each other.

The high-temperature heat electrode connecting means 303 contacts with a bottom cap of the electrothermal watch 307. A high-temperature heat electrode contact face 305 of the high-temperature heat electrode connecting means 303 is engaged with the bottom cap of the electrothermal watch 307.

The high-temperature heat source connecting means 303 is connected to electric heat converting means 304 having a power source, a switch, and a heater 308. The high-temperature heat source connecting means 303 can transmit heat efficiently by using a metal. A case 302 is a case structured to partially cover the high-temperature heat source means 304 and the high-temperature heat source connecting mean 303. The case 302 can reduce loss of the heat by using a material having its thermal conductivity lower than that of the high-temperature heat source connecting means 303. For example, aluminum or copper is used for the high-temperature heat source connecting means 303, and plastic is used for the case 302.

Here, a heater 308 is used for the high-temperature heat source means, and electric heat converting means configured by the power source and the switch is employed. Anything which generates heat can be used instead of the heater 308. Although not shown in the figure, it is possible to regulate a temperature of the high-temperature heat source of the heater 308 by turning ON/OFF the switch. In addition, it is possible to regulate the temperature of the high-temperature heat source by varying power or voltage.

A temperature of a heat source can be regulated by combining a temperature sensor for measuring a temperature of the heat sink 301, a temperature sensor for measuring a temperature of the high-temperature heat source connecting means 303, a microcomputer for indicating a temperature of a high-temperature heat source and a temperature of a low-temperature heat source and regulating the temperature of these heat sources, and the electric heat converting means 304.

In case that there are found a radiation heat resistance of the heat sink 301 and a heat resistance between a bottom cap on the high-temperature heat source side and a case on the low-temperature heat source side of the electrothermal watch, if the external temperature is already known, a temperature difference associated with the electrothermal watch can be found merely by regulating a temperature of the electric heat converting means 304; therefore, a power generation quantity can be adjusted by changing a temperature of the high-temperature heat source.

The high-temperature heat source connecting means 303 can transmit heat efficiently by employing aluminum, copper, aluminum alloy, or copper alloy, either of which is a metal having a high thermal conductivity. A metal having a relatively high thermal conductivity and rigidity should be used for the high-temperature heat source connecting means 303. Here, description of connection with the high-temperature heat source of the electrothermal watch is given; however, the description is identical with respect to connection with the low-temperature heat source. Higher thermal conductivity causes higher efficiency. A material other than such metal can be used for the high-temperature heat source connecting means 303. It can also be used with respect to connection with the low-temperature heat source. Although not shown in the figure, when plastic is used for a case, thermal conductivity is lower than a metal, and the heat is hardly transmitted, and such case serves as a heat insulating material. Loss of the heat from the case can be decreased by inserting a heat insulating material having its thermal conductivity lower than air into part or full of the inside of the case, resulting in higher efficiency. As an example of a heat insulating material having its thermal conductivity lower than air, there can be provided a material filled with a fleon gas having its thermal conductivity lower than air in bubbles generated in a foaming resin.

In FIG. 3, since a case of the electrothermal watch 307 has a heat radiation effect even if the heat sink 301 is not provided, a temperature difference is produced by warming the high-temperature heat electrode side to thereby generate power. Therefore, such heat sink is not always required. Since it is efficient that a radiation heat resistance of the heat sink 301 is lower than the case of the electrothermal watch 307, there should be provided such heat sink. In addition, the heat sink 301 can be substituted for by means for making a temperature lower than that on the heater 308 side.

As has been described hereinbefore, the heat sink 301 side corresponds to a low-temperature side, and the heater 308 side corresponds to a high-temperature side. Inversely, by placing the heater 308 side at a temperature lower than the atmosphere, the description given hereinbefore is reversed.

Although the heat sink 301 is used for the low-temperature heat source in the above description, the high-temperature heat source and the low-temperature heat source can be substituted for by anything capable of producing a state in which the high-temperature heat source has a temperature higher than the lower-temperature source in comparison between the high-temperature heat source and the low-temperature heat source.

In the case where an electronic equipment power charging system having an electrothermal power generator is divided into two or more sections, these sections can be connected by hinge or tape, thus simplifying positioning when an electrothermal power generator is set.

As described above with respect to FIG. 3, the system comprises either one or both of the high-temperature heat source means 201 and the low-temperature heat-source means 203. Further, as high-temperature heat source means, there is employed a heater 308 that is an example of electric heat converting means. Further, as low-temperature heat source means, there is provided a heat sink that is an example of heat radiating means for radiating heat in air. Still further, a metal plate is connected to the heater 308 as high-temperature heat electrode connecting means for bringing the high-temperature heat source means into contact with the high-temperature heat electrode side of the electronic watch 307. Furthermore, the heat sink 301 made of a metal is employed also as low-temperature heat source connecting means. Still furthermore, the electronic watch and high-temperature and low-temperature heat source connecting means are engaged with each other. Furthermore, there is provided the structure comprised of two sections, i.e., the high-temperature heat source side and the low-temperature heat source side. Still further, although not shown in the figure, the divided two sections of the structure are connected to each other by hinge or tape. Moreover, the case on the high-temperature heat source side is made of plastic serving as a case itself and heat insulating means. Still moreover, the case is used also for a high-temperature heat source side that is part of the electronic equipment power charging system having the electrothermal power generator. Although the above structures are described in one embodiment in FIG. 3, the respective structural elements can be used separately.

Figure 4:
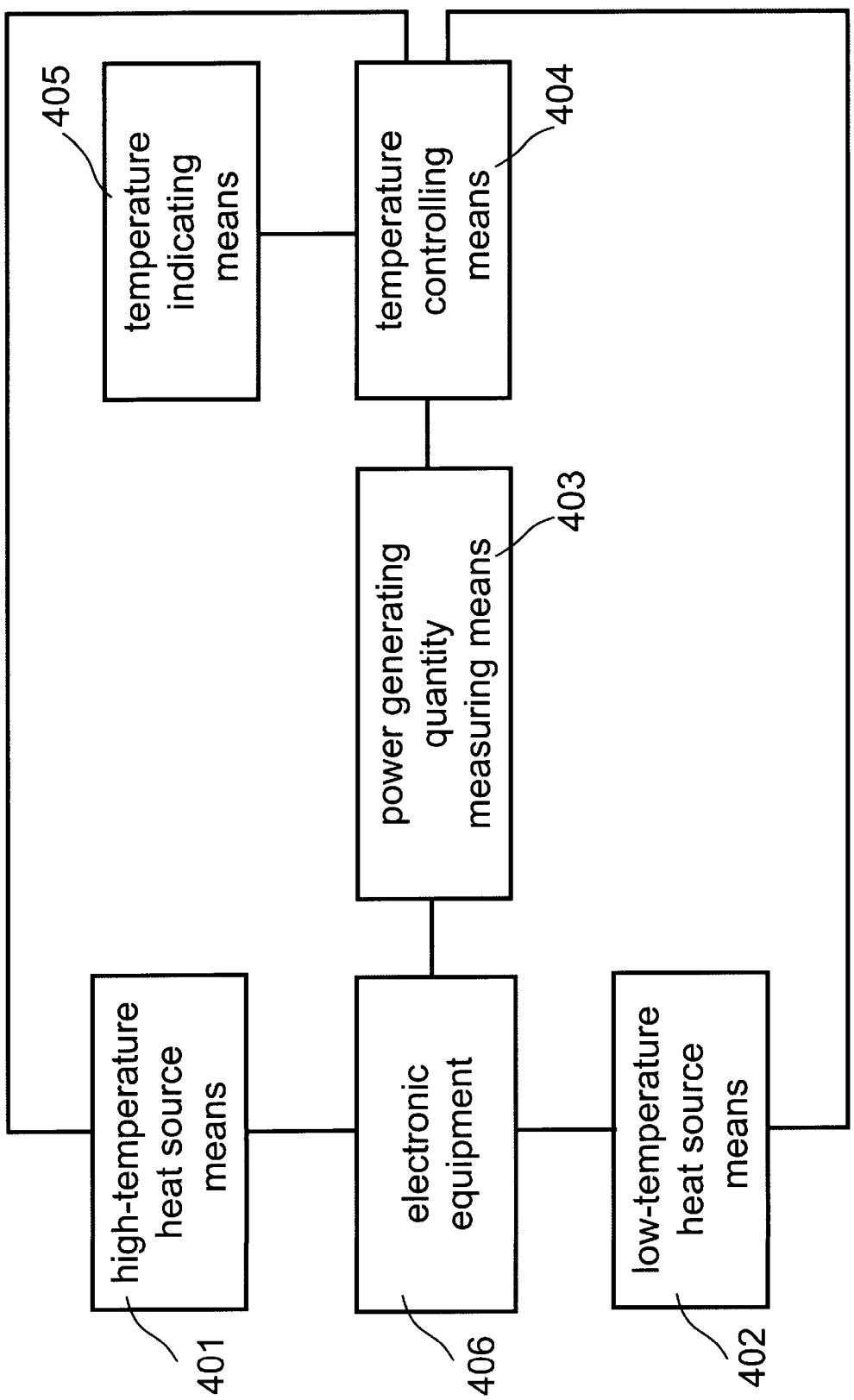
FIG. 4 is a structural view of a third embodiment of an electronic equipment power charging system having an electrothermal power generator according to the present invention.

FIG. 4 is a structural view of a third embodiment of an electronic equipment power charging system having an electrothermal power generator in embodiments according to the present invention.

The electronic equipment power charging system having the electrothermal power generator comprises high-temperature heat source means 401, low-temperature heat source means 402, power generation quantity measuring means 403 for measuring a power generation quantity of an electrothermal power generator 406, and temperature controlling means 404 for regulating temperatures of the high-temperature heat source means 401 and the low-temperature heat source means 402 from a temperature indicated by temperature indicating means 405 and a power generation quantity measured by the power generation quantity measuring means 403.

When a relationship between generating power of the electrothermal power generator 406 and temperature difference between the heat electrodes is found, it is possible to control such temperature difference through a power generation quantity. For example, in the case of an electrothermal power generator that generates power by imparting a temperature difference using the principle of Seebech effect, its generated voltage is proportional to such temperature difference. Therefore, the temperature difference can be regulated by controlling the difference to be increased or decreased when a monitored voltage is lower or higher. The power generation quantity measuring means 403 measures a generated voltage of the electrothermal power generator 406. The temperature controlling means 404 varies temperatures of the high-temperature heat source means 401 and the low-temperature heat source means 402 so as to increase the generated voltage. Also, the temperature controlling means controls an absolute temperature by the temperature indicating means 405.

By setting temperatures of the high-temperature heat source means 401 and the low-temperature heat source means 402 in advance for the temperature difference indicating means 405, it is possible for the temperature difference controlling means 404 to control temperatures so as to be these set temperature. In addition, it is possible to produce a temperature difference using either one of the high-temperature heat source means 401 and the low-temperature heat source means 402. This makes it possible to charge power of the electrothermal power generator without using the power generation quantity measuring means.

Figure 11:
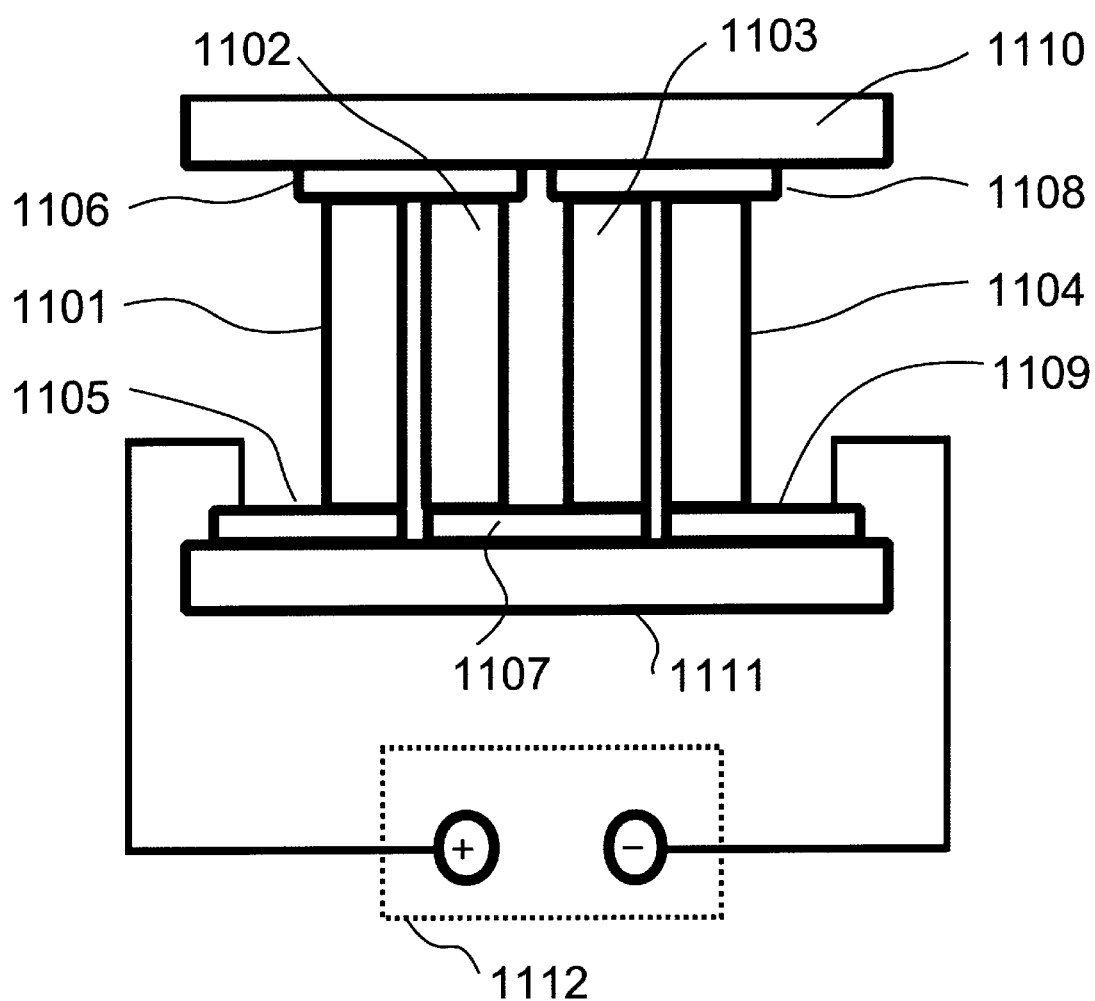
FIG. 11 is a sectional view exemplifying an electrothermal semiconductor element employed in embodiments according to the present invention.

FIG. 11 is a sectional view of an example of an electrothermal semiconductor element employed in embodiments according to the present invention. One end of a first n-type semiconductor electrothermal element 1101 is electrically connected to one end of a first p-type semiconductor electrothermal element 1102 via a first electrode 1106 that is electrically conductive. The other end of the first p-type semiconductor electrothermal element 1102 is electrically connected to one end of a second n-type semiconductor electrothermal element 1103 via a second electrode 1107 that is electrically conductive. The other end of the second n-type semiconductor electrothermal element 1103 is electrically connected to one end of a second p-type semiconductor electrothermal element 1104 via a third electrode 1108 that is electrically conductive. The other end of the first n-type semiconductor electrothermal element 1101 is electrically connected to a positive electrode 1105 that is electrically conductive. The other end of the second p-type semiconductor electrothermal element 1104 is electrically connected to a negative electrode 1109 that is electrically conductive. The first electrode 1106 and the third electrode 1108 are electrically connected to a first insulating substrate 1110 that is an electrical insulator. The positive electrode 1105, the negative electrode 1109, and the second electrode 1107 are connected to a second insulating substrate 1111 that is an electrical insulator. The positive electrode 1105 is connected to a positive side of the electrode terminal 1112, and further a negative electrode 1109 is connected to a negative side of the electrode terminal 1112. The first insulating substrate 1110 side is cooled and the second insulating substrate 1111 side is heated by the Peltier effect by imparting electric energy to the electrode terminal 1112 from the outside. A temperature difference is produced between the first insulating substrate 1110 and the second insulating substrate 1111 is produced by feeding a current. In FIG. 11, a more detailed description thereof is given for clarity by using two pairs of the n-type semiconductor electrothermal element and the p-type semiconductor electrothermal element. In principle, it is possible to produce a temperature difference by the Peltier effect when one or more pair is employed. Generally, plural pairs of the n-type semiconductor electrothermal elements and p-type semiconductor electrothermal elements are employed by connecting them in series. By feeding a current in a reverse direction, the first insulating substrate 1110 side is heated, and the second insulating substrate 1111 side is cooled.

Figure 6:
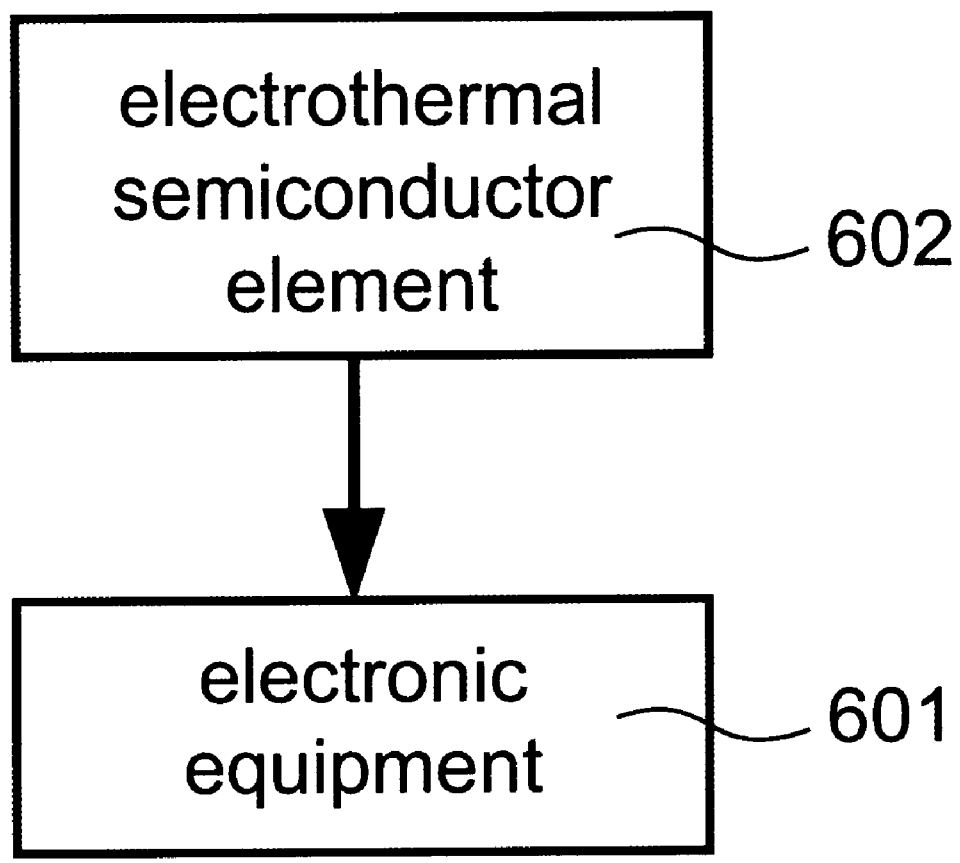
FIG. 6 is a structural view showing a fourth embodiment of an electronic equipment power charging system according to the present invention.

FIG. 6 is a structural view showing a fourth embodiment of an electronic equipment power charging system according to the present invention. The system comprises electronic equipment having an electrothermal power generator and an electrothermal semiconductor element that is adjacent to or in contact with the electronic equipment and that produces a temperature difference using external electric energy. An electrothermal semiconductor element 602 converts the external electric energy to heat and produces a temperature difference. Electronic equipment 601 is electronic equipment having an electrothermal power generator. The heat produced at the electrothermal semiconductor element 602 is imparted to at least one heat electrode of the electrothermal power generator incorporated in electronic equipment to be adjacent thereto or in contact therewith, and thereby the electrothermal power generator incorporated in the electronic equipment can acquire a temperature difference and generates power. In addition, the heat on the heating side produced by the electrothermal semiconductor element 602 is transmitted to the high-temperature heat electrode side of the electrothermal power generator incorporated in the electronic equipment, and the heat on the cooling side produced by the electrothermal semiconductor element 602 is further transmitted to the low-temperature heat electrode side of the electrothermal power generator incorporated in the electronic equipment, and thereby the electrothermal power generator can acquire a temperature difference and generates power.

Figure 7:
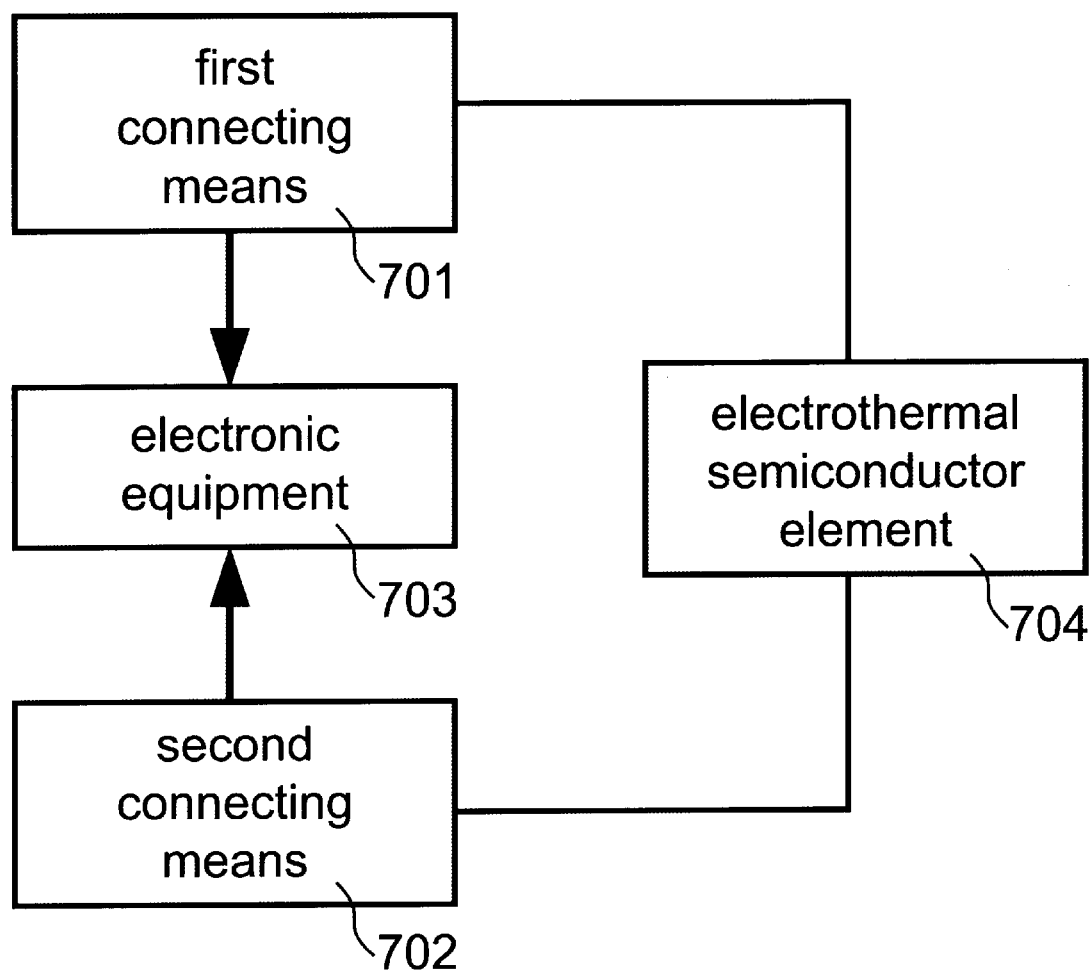
FIG. 7 is a structural view showing a fifth embodiment of an electronic equipment power charging system according to the present invention.

FIG. 7 is a structural view showing a fifth embodiment of an electronic equipment power charging system according to the present invention. An electrothermal semiconductor element 704 is an element in which one side is cooled and the other side is heated when a current is fed. For example, in FIG. 11, there is a sectional view exemplifying an electrothermal semiconductor element employed in embodiment according to the present invention. The heat on the cooling side of the electrothermal semiconductor element 704 is transmitted to a low-temperature heat electrode side of the electronic equipment 703 using second connecting means 702. The heat on the heating side of the electrothermal semiconductor element 704 is transmitted to the high-temperature heat electrode side of the electronic equipment 703 using first connecting means 701. The electronic equipment 703 acquires a temperature difference produced at the electrothermal semiconductor element 704 and generates power. It is desirable that the first connecting means 701 and the second connecting means 702 be made of a thermally conductive material. For example, it is desirable that the material with a relatively high thermal conductivity have heat resistance of 10 W/K•m or more. A pure material such as copper, aluminum, titanium, or iron or its alloy should be desirably employed. When the heat produced by the heating side of the electrothermal semiconductor element 704 is higher than the atmospheric temperature, the heat generated at the electrothermal semiconductor element 704 is transmitted to the high-temperature heat electrode side of the electronic equipment 703 by employing the first connecting means 701, and the low-temperature heat electrode side of the electronic equipment 703 is exposed in air, and a temperature difference between the electronic equipment and the atmosphere is produced, thereby enabling for power generation. On the contrary, if the temperature on the cooling side of the electrothermal semiconductor element 704 is lower than that of the atmosphere, the heat generated by the electrothermal semiconductor element 704 is transmitted to the low-temperature heat electrode side of the electronic equipment 703 by employing the second connecting means 701, and a temperature difference is produced at the electronic equipment 703, thereby enabling for power generation.

Figure 8:
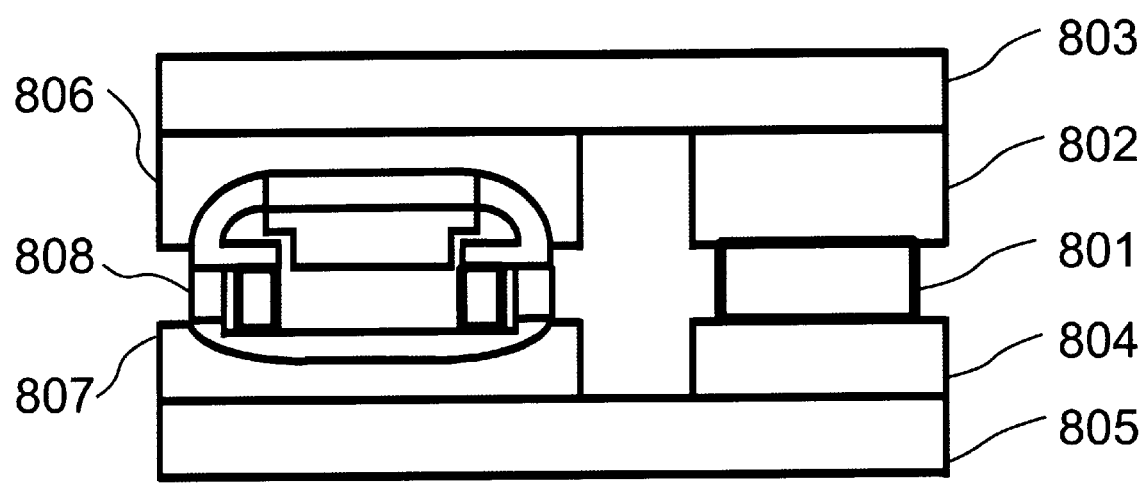
FIG. 8 is a sectional view showing a sixth embodiment of an electronic equipment power charging system according to the present invention.

FIG. 8 is a sectional view showing a sixth embodiment of an electronic equipment power charging system according to the present invention. A electrothermal semiconductor element 801 conduct heating and cooling operation when a current is applied. A first connecting connector 806 and a third connecting connector 802 are fixed to a first supporting plate 803. A fourth connecting connector 804 and a second connecting connector 807 are fixed to a second supporting plate 805. An electrothermal watch 808 is an electrothermal watch described in a sectional view of an electronic watch representing an embodiment of electronic equipment having an electrothermal power generator according to the present invention as shown in FIG. 5. The heat on the high-temperature side generated at the electrothermal semiconductor element 801 is transmitted to the high-temperature heat electrode side of the electrothermal watch 808 through the fourth connecting connector 804, a second supporting plate 805, and a second connecting connector 807. The heat on the low-temperature side generated at the electrothermal semiconductor element 801 is transmitted to the low-temperature heat electrode side of the electrothermal watch 808 through the third connecting connector 802, the first supporting plate 803, and the first connecting connector 806. The first connecting connector 806 and the second connecting connector 807 are engaged with the electrothermal watch 808 to reduce a thermal loss. The third connecting connector 802, the fourth connecting connector 804, and the electrothermal element 801 are engaged with each other to reduce a thermal loss. The third connecting connector 802, the first supporting plate 803, and the first connecting connector 806 is also employed as heat connecting means on the low-temperature side of the electrothermal semiconductor element 801. The fourth connecting connector 804, the second supporting plate 805, and the second connecting connector 807 is also employed as heat connecting means on the high-temperature side of the electrothermal semiconductor element 801. The sixth embodiment of the invention is structured as described above.

A description of generating a no-load voltage of 1.5 V at the electrothermal power generator incorporating an electrothermal watch 808 will now be given.

Assuming that an internal resistance of an electrothermal power generator 505 is 1,000 Ω, power of 2.25 mW is generated by generating power at a no-load voltage of 1.5 V. This power generation quantity is effective for a secondary battery used for the watch. A heat resistance between a bottom cap 507 of the electrothermal watch 808 and a case 503 is about 15° C./W. An actual temperature difference associated with the electrothermal power generator 505 is 50% of the temperature difference between the bottom cap 507 and the case 503 in consideration of a thermal flow loss. In addition, the electrothermal power generator 505 has a generated voltage of 0.2 V for each 1° C. The electrothermal power generator 505 requires a temperature difference of 7.5° C. to obtain a no-load voltage of 1.5 V. The electrothermal power generator 505 requires a temperature difference of 15° C. between the bottom cap 507 and the case 503 in order to obtain a temperature difference of 7.5° C. It is required to feed a heat rate of 1 W between the bottom cap 507 and the case 503 to obtain a temperature difference of 15° C. between the bottom cap 507 and the case 503. In the case of an atmospheric temperature of 30° C., the temperatures of the first supporting plate 803, the first connecting connector 806, and the third connecting connector 802 are set to 30° C., and an electrothermal semiconductor element 801 whose coefficient of performance is 1 is employed. The coefficient of performance is a ratio of heat absorption energy to input energy. The heat from the electrothermal semiconductor element 801 is thermal flow that passes through the fourth connecting connector 804, the second supporting plate 805, the second connecting connector 807, the electrothermal watch 808, the first connecting connector 806, the first supporting plate 803, and the third connecting connector 802 and returns to the electrothermal semiconductor element 801. In a course of this thermal flow, a thermal loss of 1 W occurs. It is required to apply energy of 2 W to an electrothermal semiconductor element in order for the electrothermal watch to generate a no-load voltage of 1.5 V using the equipment and conditions described above. It is desirable that the first supporting plate 803, the second supporting plate 805, the first connecting connector 806, the second connecting connector 807, the third connecting connector 802, and the forth connecting connector 806 be thermally conductive. A material with a relatively high thermal conductivity, for example, having its heat resistance of 10 W/K•m or more should be desirably employed. A pure material such as copper, aluminum, titan, or iron or its alloy should be desirably employed. Further, a thermal flow loss is liable to occur at a contact or adjacent site between the first connecting connector 806 and the electrothermal watch 808, between the second connecting connector 807 and the electrothermal watch 808, between the third connecting connector 802 and the electrothermal semiconductor element 801, or between the fourth connecting connector 804 and the electrothermal semiconductor element 801. A method for reducing such a thermal loss includes increasing an effective contact area by applying a pressure compared with a case where such pressure is not applied, or filling a thermal-conductivity silicone grease having its thermal conductivity better than air and a thermally conductive adhesive. When a pressure is applied, it is required to regulate such pressure according to the rigidity of electronic equipment or components. The presence of a circuit for regulating electric energy applied to an electrothermal semiconductor element or a circuit for controlling a temperature (not shown) enables more stable power generation.

Figure 9:
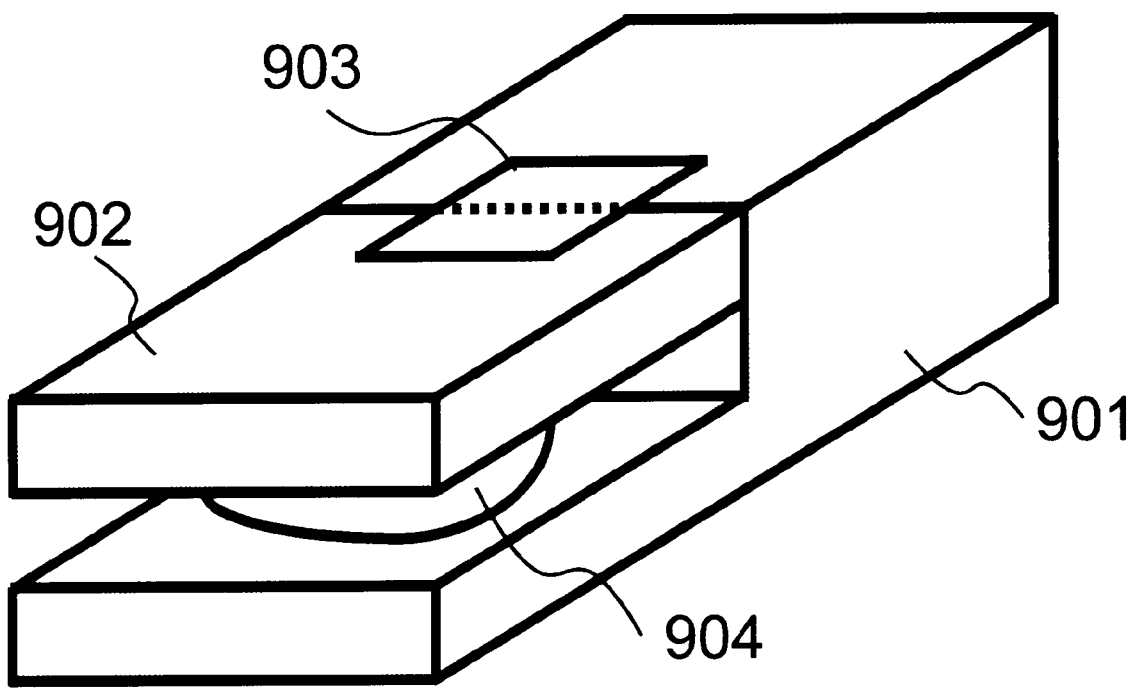
FIG. 9 is a perspective view showing a seventh embodiment of an electronic equipment power charging system according to the present invention.

FIG. 9 is a perspective view showing a seventh embodiment of an electronic equipment power charging system according to the present invention. The power charging system comprises a first case 901, a second case 902, a hinge 903, and an electrothermal watch 904. The first case 901 and the second case 902 are configured in two pairs. The hinge 903 connects the first case 901 and the second case 902. Instead of the hinge, a tape, a spring, or a screw may be employed for fixing. The first case 901 and the second case 902 contain an electronic equipment power charging system. It is possible to employ a structure such that the first supporting plate 803 of the sixth embodiment serves as the second case 902 and a second supporting plate 80S serves as the first case 901. The first case 901 and the second case 902 are configured separately, thus facilitating attachment to an electrothermal watch 904. In addition, operation of the electrothermal watch 904 is possible from the side face.

Figure 10:
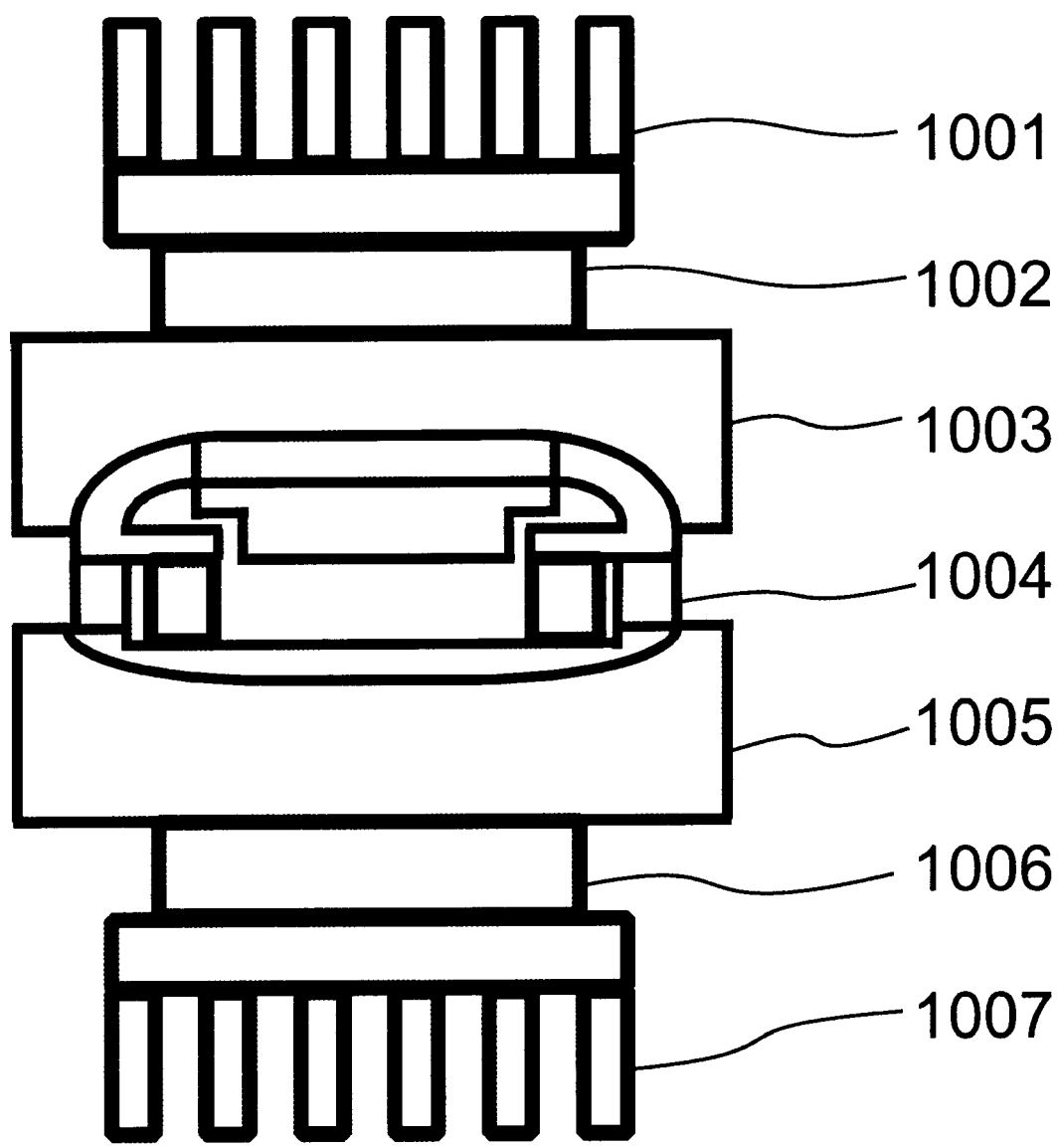
FIG. 10 is a sectional view showing an eighth embodiment in an electronic equipment power charging system according to the present invention.

FIG. 10 is a sectional view showing an eighth embodiment in an electronic equipment power charging system according to the present invention. This system comprises a first heat sink 1001, a first electrothermal semiconductor element 1002, a first connecting connector 1003, an electrothermal watch 1004, a second connecting connector 1005, and a second electrothermal semiconductor element 1006, and a second heat sink 1007.

The heat on a cooling side of the second electrothermal semiconductor element 1006 is transmitted to the low-temperature heat electrode side of the electrothermal watch 1004 via the second connecting connector 1005. The heat on the heating side of the first electrothermal semiconductor element 1002 is transmitted to the high-temperature heat electrode side of the electrothermal watch 1004 via the first connecting connector 1003. Since the electrothermal watch 1004 can acquire a temperature difference, power is generated. The heating side of the first electrothermal semiconductor element 1002 is connected to the first heat sink 1001, the generated heat is radiated to the outside, and thereby a temperature difference between the cooling side and the heating side of the first electrothermal semiconductor element 1002 can be acquired. The cooling side of the second electrothermal semiconductor element 1006 is connected to the second heat sink 1007, the cooled heat is radiated to the outside, and thereby a temperature difference between the cooling side and the heating side of the second electrothermal semiconductor element 1006 can be acquired. Now, it is assumed that the atmospheric air is 30° C. A current is fed to the first electrothermal semiconductor element 1002, and the first connecting connector 1003 is set to 25° C. In addition, a current is fed to the second electrothermal semiconductor element 1006, and the second connecting connector 1005 is set to 40° C. Since a temperature difference of 15° C. is imparted to the electrothermal watch 1004, a no-load voltage of 1.5 V is generated at the electrothermal watch 1004 as described in the sixth embodiment.

Figure 12:
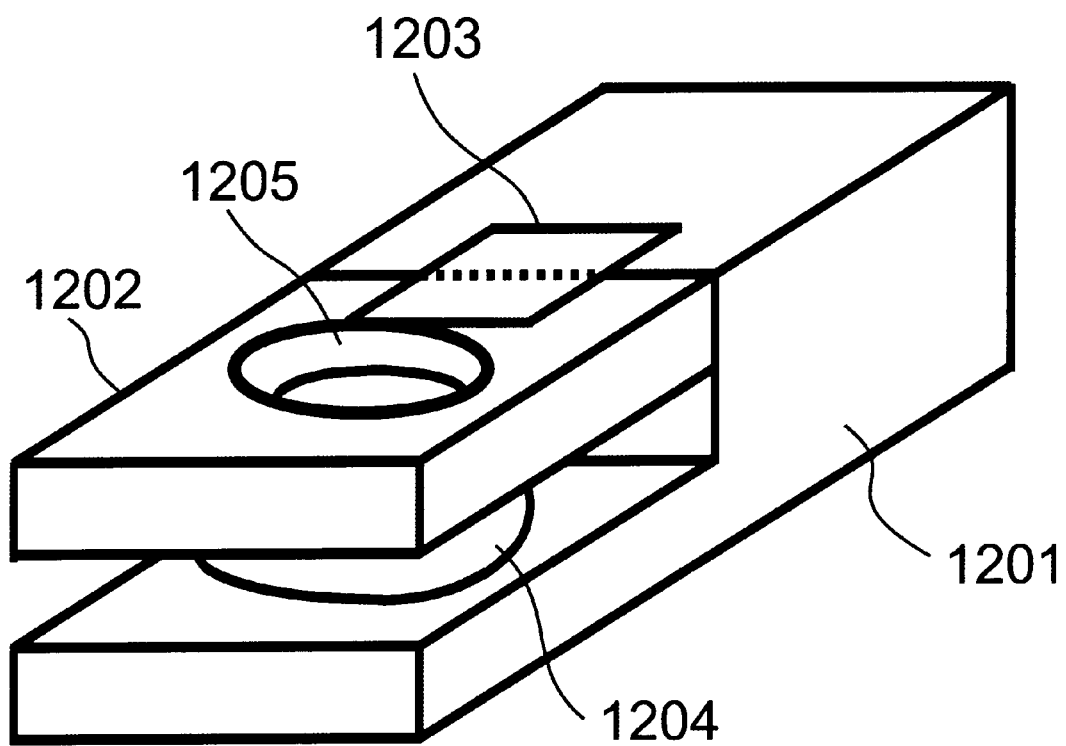
FIG. 12 is a perspective view showing a ninth embodiment in an electronic equipment power charging system according to the present invention.

FIG. 12 is a perspective view showing a ninth embodiment in an electronic equipment power charging system according to the present invention. The system comprises a first case 1201, a second case 1202, a hinge 1203, an electrothermal watch 1204, and a window 1205. The window 1205 is added to the construction shown in the seventh embodiment so that a display of the electrothermal watch 1204 can be seen. By providing the window, time can be recognized even when the electrothermal watch is charged. Operation for setting time is possible from the side face. Further, the window 1205 and the second case 1202 are made of glass or plastics, thereby making it possible to see the display of the electrothermal watch.

As is obvious in the foregoing description, in an electronic equipment power charging system having an electrothermal power generator according to the present invention, a temperature difference is produced by the temperature difference producing means using energy from the outside of the power charger, and the temperature difference is imparted to electronic equipment having an electrothermal power generator, to thereby make it possible for the electrothermal power generator to generate power even under an environment free of a temperature difference.

Further, a temperature of the heat imparted to the low-temperature heat electrode and the high-temperature heat electrode of the electrothermal power generator is measured, or a power generation quantity of the electrothermal power generator is measured by power generation quantity measuring means, and a temperature of a heat source is fed back by using temperature indicating means and temperature controlling means, and thereby reliability and stability of power generation of the electrothermal power generator can be improved.

A heat source can be easily obtained by using electric heat converting means for the heat source. Use of a case or a heat insulating material therein can reduce a thermal loss, thus acquiring higher efficiency. By engaging the power charger and electronic equipment with each other, a loss in thermal conducting to the electrothermal power generator can be reduced, and positioning can be performed, thereby making it easy to set the electronic equipment. Further, there is eliminated a need for employing complex means such as electric circuit by using heat radiation to air for a low-temperature heat source. Even under an environment where an electrothermal power generator cannot acquire a temperature difference, the energy from the outside is converted to heat, and a temperature difference is forcibly produced, thereby enabling power generation.

An electrothermal semiconductor element is used for electric heat converting means, thereby making it possible to perform heating and cooling simultaneously.

A window is provided, thus making it possible to see the display even during charging.

What is claimed is:

1. An electronic equipment power charging system comprising:

an electrothermal power generator for generating electrical power using a temperature difference, the electrothermal power generator having a low-temperature heat electrode and a high-temperature heat electrode;

an electronic equipment having power accumulating means for accumulating electrical power generated by the electrothermal power generator; and temperature difference producing means for converting external electrical energy to heat and producing the temperature difference used by the electrothermal power generator, the temperature difference producing means having at least one of high-temperature heat source means for heating the high-temperature heat electrode of the electrothermal power generator at a temperature higher than that of the low-temperature heat electrode and low-temperature heat source means for heating the low-temperature heat electrode of the electrothermal power generator at a temperature lower than that of the high-temperature heat electrode, the high-temperature heat source means having electric heat converting means for converting electrical energy to heat, and the low-temperature heat source means having heat radiating means for radiating heat from the low-temperature heat electrode of the electrothermal power generator to the exterior of the electronic equipment power charging system.

2. An electronic equipment power charging system comprising:

an electrothermal power generator for generating electrical power using a temperature difference, the electrothermal power generator having a low-temperature heat electrode and a high-temperature heat electrode;

an electronic equipment having power accumulating means for accumulating electrical power generated by the electrothermal power generator;

temperature difference producing means for converting external electrical energy to heat and producing the temperature difference used by the electrothermal power generator, the temperature difference producing means having at least one of high-temperature heat source means for heating the high-temperature heat electrode of the electrothermal power generator at a temperature higher than that of the low-temperature heat electrode and low-temperature heat source means for heating the low-temperature heat electrode of the electrothermal power generator at a temperature lower than that of the high-temperature heat electrode;

at least one of first temperature measuring means for measuring a temperature of the high-temperature heat source means and second temperature measuring means for measuring a temperature of the low-temperature heat source means;

temperature controlling means for controlling the temperature of at least one of the high-temperature heat source means and the low-temperature heat source means in accordance with the temperature measured by the first measuring means or the second measuring means, respectively of the high-temperature heat source means and the low-temperature heat source means; and temperature indicating means for providing an indication of either one or both of the temperatures of the high-temperature heat source means and the low-temperature heat source means to the temperature controlling means.

3. An electronic equipment power charging system comprising:

an electrothermal power generator for generating electrical power using a temperature difference, the electrothermal power generator having a low-temperature heat electrode and a high-temperature heat electrode;

an electronic equipment having power accumulating means for accumulating electrical power generated by the electrothermal power generator;

temperature difference producing means for converting external electrical energy to heat and producing the temperature difference used by the electrothermal power generator, the temperature difference producing means having at least one of high-temperature heat source means for heating the high-temperature heat electrode of the electrothermal power generator at a temperature higher than that of the low-temperature heat electrode and low-temperature heat source means for heating the low-temperature heat electrode of the electrothermal power generator at a temperature lower than that of the high-temperature heat electrode;

power generation quantity measuring means for measuring a quantity of power produced by the electrothermal power generator;

temperature controlling means for controlling the temperature of at least one of the high-temperature heat source means and the low-temperature heat-source means in accordance with the quantity of power measured by the power generation quantity measuring means; and temperature indicating means for providing an indication of either one or both of the temperatures of the high-temperature heat source means and the low-temperature heat source means to the temperature controlling means.

4. An electronic equipment power charging system comprising:

an electrothermal power generator for generating electrical power using a temperature difference, the electrothermal power generator having a low-temperature heat electrode and a high-temperature heat electrode;

an electronic equipment having power accumulating means for accumulating electrical power generated by the electrothermal power generator;

temperature difference producing means for converting external electrical energy to heat and producing the temperature difference used by the electrothermal power generator, the temperature difference producing means having at least one of high-temperature heat source means for heating the high-temperature heat electrode of the electrothermal power generator at a temperature higher than that of the low-temperature heat electrode and low-temperature heat source means for heating the low-temperature heat electrode of the electrothermal power generator at a temperature lower than that of the high-temperature heat electrode;

at least one of high-temperature electrode connecting means for transmitting heat generated by the high-temperature heat source means to the high-temperature heat electrode of the electrothermal power generator and low-temperature heat electrode connecting means for transmitting heat generated by the low-temperature heat source means to the low-temperature heat electrode of the electrothermal power generator electronic equipment.

5. An electronic equipment power charging system as claimed in claim 4; wherein the at least one of the high-temperature heat electrode connecting means and the low-temperature heat electrode connecting means is comprised of metal.

6. An electronic power charging system as claimed in claim 4; wherein at least a part of the at least one of the high-temperature heat electrode connecting means and the low-temperature heat electrode connecting means engages the electronic equipment.

7. An electronic equipment power charging system as claimed in claim 4; further comprising support means for supporting one or more of the high-temperature heat source means, the high-temperature heat electrode connecting means, the low-temperature heat source means, and the low-temperature electrode connecting means.

8. An electronic equipment power charging system as claimed in claim 4; wherein the high-temperature heat electrode connecting means or the low-temperature heat electrode connecting means comprises support means for supporting the high-temperature heat source means or the low-temperature heat source means.

9. An electronic equipment power charging system as claimed in claim 4; further comprising a case covering at least a part of the electronic equipment power charging system, the case having support means for supporting one or more of the high-temperature heat source means, the high-temperature heat electrode connecting means, the low-temperature heat source means, and the low-temperature electrode connecting means.

10. An electronic power charging system comprising:

an electrothermal power generator for generating electrical power using a temperature difference, the electrothermal power generator having a low-temperature heat electrode and a high-temperature heat electrode;

an electronic equipment having power accumulating means for accumulating electrical power generated by the electrothermal power generator;

temperature difference producing means for converting external electrical energy to heat and producing the temperature difference used by the electrothermal power generator, the temperature difference producing means having at least one of high-temperature heat source means for heating the high-temperature heat electrode of the electrothermal power generator at a temperature higher than that of the low-temperature heat electrode and low-temperature heat source means for heating the low-temperature heat electrode of the electrothermal power generator at a temperature lower than that of the high-temperature heat electrode; and a case covering at least a part of the electronic equipment power charging system.

11. An electronic equipment power charging system as claimed in claim 10; wherein at least a part of the case comprises an insulating material for insulating the electronic equipment power charging system.

12. An electronic equipment power charging system as claimed in claim 10; wherein the case comprises at least two or more separate sections.

13. An electronic equipment power charging system as claimed in claim 12; further comprising connecting means for connecting the separate sections of the case.

14. An electronic equipment power charging system comprising:

an electrothermal power generator for generating electrical power using a temperature difference, the electrothermal power generator having a low-temperature heat electrode and a high-temperature heat electrode;

an electronic equipment having power accumulating means for accumulating electrical power generated by the electrothermal power generator; and temperature difference producing means for converting external electrical energy to heat and producing the temperature difference used by the electrothermal power generator, the temperature difference producing means having at least one of high-temperature heat source means for heating the high-temperature heat electrode of the electrothermal power generator at a temperature higher than that of the low-temperature heat electrode and low-temperature heat source means for heating the low-temperature heat electrode of the electrothermal power generator at a temperature lower than that of the high-temperature heat electrode, the at least one of the high-temperature heat source means and low-temperature heat source means comprising electric heat converting means for converting electrical energy to heat.

15. An electronic equipment power charging system as claimed in claim 14; wherein the electric converting means has an electrothermal semiconductor element comprised of at least an n-type semiconductor electrothermal element and a p-type semiconductor electrothermal element.

16. An electronic equipment power charging system comprising:

an electrothermal power generator for generating electrical power using a temperature difference, the electrothermal power generator having a low-temperature heat electrode and a high-temperature heat electrode;

an electronic equipment having power accumulating means for accumulating electrical power generated by the electrothermal power generator; and temperature difference producing means for converting external electrical energy to heat and producing the temperature difference used by the electrothermal power generator, the temperature difference producing means having at least one of high-temperature heat source means for heating the high-temperature heat electrode of the electrothermal power generator at a temperature higher than that of the low-temperature heat electrode and low-temperature heat source means for heating the low-temperature heat electrode of the electrothermal power generator at a temperature lower than that of the high-temperature heat electrode, the at least one of the high-temperature heat source means and the low-temperature heat source means having heat radiating means for radiating heat to the exterior of the electronic equipment power charging system, and the at least one of the high-temperature heat source means and the low-temperature heat source means having an electrothermal semiconductor element comprised of an n-type semiconductor electrothermal element and a p-type semiconductor electrothermal element.

17. An electronic equipment power charging system comprising:

an electrothermal power generator for generating electrical power using a temperature difference, the electrothermal power generator having a low-temperature heat electrode and a high-temperature heat electrode;

an electronic equipment having power accumulating means for accumulating electrical power generated by the electrothermal power generator; and temperature difference producing means for converting external electrical energy to heat and producing the temperature difference used by the electrothermal power generator, the temperature difference producing means having at least one of high-temperature heat source means for heating the high-temperature heat electrode of the electrothermal power generator at a temperature higher than that of the low-temperature heat electrode and low-temperature heat source means for heating the low-temperature heat electrode of the electrothermal power generator at a temperature lower than that of the high-temperature heat electrode, the at least one of the high-temperature heat source means and the low-temperature heat source means having heat radiating means comprised of a heat sink for radiating heat to exterior of the electronic equipment power charging system.

18. An electronic equipment power charging system comprising:

an electrothermal power generator for generating electrical power using a temperature difference, the electrothermal power generator having a low-temperature heat electrode and a high-temperature heat electrode;

an electronic equipment having power accumulating means for accumulating electrical power generated by the electrothermal power generator, and a display portion for displaying information and viewable from at least an exterior part of the electronic equipment power charging system; and temperature difference producing means for converting external electrical energy to heat and producing the temperature difference used by the electrothermal power generator, the temperature difference producing means having at least one of high-temperature heat source means for heating the high-temperature heat electrode of the electrothermal power generator at a temperature higher than that of the low-temperature heat electrode and low-temperature heat source means for heating the low-temperature heat electrode of the electrothermal power generator at a temperature lower than that of the high-temperature heat electrode.

19. An electronic equipment power charging system comprising:

an electrothermal power generator for generating electrical power using a temperature difference, the electrothermal power generator having a low-temperature heat electrode and a high-temperature heat electrode;

an electronic equipment having power accumulating means for accumulating electrical power generated by the electrothermal power generator;

temperature difference producing means for converting external electrical energy to heat and producing the temperature difference used by the electrothermal power generator, the temperature difference producing means having at least one of high-temperature heat source means for heating the high-temperature heat electrode of the electrothermal power generator at a temperature higher than that of the low-temperature heat electrode and low-temperature heat source means for heating the low-temperature heat electrode of the electrothermal power generator at a temperature lower than that of the high-temperature heat electrode; and a case covering at least a part of the electronic equipment power charging system, at least part of the case being comprised of a transparent material.

20. An electronic equipment power charging system as claimed in claim 18; further comprising at least one or more windows for viewing at least a part of the display portion of the electronic equipment from the exterior part of the electronic equipment power charging system.

21. An electronic equipment power charging system comprising:

an electrothermal power generator for generating electrical power using a temperature difference, the electrothermal power generator having a low-temperature heat electrode and a high-temperature heat electrode;

an electronic equipment having power accumulating means for accumulating electrical power generated by the electrothermal power generator;

means for permitting operation of the electronic equipment from the exterior of the electronic equipment power charging system; and temperature difference producing means for converting external electrical energy to heat and producing the temperature difference used by the electrothermal power generator, the temperature difference producing means having at least one of high-temperature heat source means for heating the high-temperature heat electrode of the electrothermal power generator at a temperature higher than that of the low-temperature heat electrode and low-temperature heat source means for heating the low-temperature heat electrode of the electrothermal power generator at a temperature lower than that of the high-temperature heat electrode.

22. An electronic equipment power charging system as claimed in claim 21; wherein the means for permitting operation of the electronic equipment from the exterior of the electronic equipment power charging system comprises at least one window.

23. An electronic equipment power charging system comprising: a first heat source for outputting heat having a first temperature; first temperature measuring means for measuring the first temperature; a second heat source for outputting heat having a second temperature different from the first temperature; second temperature measuring means for measuring the second temperature; an electronic equipment having an electrothermal power generator for receiving the heat from the first and second heat sources and for generating power in accordance with a temperature difference between the first and second temperatures to drive the electronic equipment; and temperature control means for controlling the first and second temperatures in accordance with the temperatures measured by the first and second measuring means.

24. An electronic equipment power charging system according to claim 23; wherein the electronic equipment has a storing device for storing the power generated by the electrothermal power generator.

25. An electronic equipment power charging system according to claim 23; wherein the electronic equipment comprises an electronic timepiece.

26. An electronic equipment power charging system according to claim 23; further comprising means for outputting temperature data corresponding to preselected temperature values of the first and second temperatures; and wherein the temperature control means controls the first and second temperatures in accordance with the temperature data.

27. An electronic equipment power charging system according to claim 23; wherein the first and second heat sources are in contact with the electronic equipment.

28. An electronic equipment power charging system according to claim 23; wherein at least one of the first and second heat sources comprises an electrothermal semiconductor element.

29. An electronic equipment power charging system according to claim 23; wherein at least one of the first and second heat sources comprises an n-type semiconductor electrothermal element and a p-type semiconductor electrothermal element.

30. In combination: temperature difference producing means for converting electrical energy to heat to produce a temperature difference; an electronic timepiece having an electrothermal power generator for generating electrical power using the temperature difference produced by the temperature difference producing means to drive the electronic timepiece; measurement means for measuring the temperature difference produced by the temperature difference producing means; and control means for controlling the temperature difference produced by the temperature difference producing means in accordance with the temperature measured by the measurement means.

31. An electronic equipment power charging system comprising: a temperature difference producing device having heat sources for outputting heat having different temperatures to produce a temperature difference; an electronic equipment having an electrothermal power generator for generating electrical power using the temperature difference produced by the temperature difference producing device to drive the electronic equipment; measurement means for measuring the temperatures of the heat outputted by the heat sources of the temperature difference producing device; and control means for controlling the temperatures of the heat outputted by the heat sources of the temperature difference producing device in accordance with the temperatures measured by the measurement means.

32. An electronic equipment power charging system according to claim 31; wherein the electronic equipment comprises an electronic timepiece.

33. An electronic equipment power charging system comprising:

an electrothermal power generator for generating electrical power using a temperature difference, the electrothermal power generator having a low-temperature heat electrode and a high-temperature heat electrode;

an electronic equipment having power accumulating means for accumulating electrical power generated by the electrothermal power generator;

temperature difference producing means for converting external electrical energy to heat and producing the temperature difference used by the electrothermal power generator, the temperature difference producing means having at least one of high-temperature heat source means for heating the high-temperature heat electrode of the electrothermal power generator at a temperature higher than that of the low-temperature heat electrode and low-temperature heat source means for heating the low-temperature heat electrode of the electrothermal power generator at a temperature lower than that of the high-temperature heat electrode;

heat insulating means covering at least a part of the electronic equipment power charging system for insulating the electronic equipment power charging system to reduce thermal loss.

* * * * *